United States Patent
Bestul et al.

(10) Patent No.: US 6,302,703 B1
(45) Date of Patent: Oct. 16, 2001

(54) CONNECTOR FOR SENDING POWER TO AN IC-CHIP THRU FOUR PRESSED JOINTS IN SERIES

(75) Inventors: Mark DeWayne Bestul, Poway; Leonard Harry Alton, Escondido; Terrence Evan Lewis; Ronald Jack Kuntz, both of San Diego; James Dunbar Walker, Escondido, all of CA (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/686,039

(22) Filed: Oct. 11, 2000

(51) Int. Cl.[7] .............................. H01R 12/00; H05K 1/00

(52) U.S. Cl. ............................................. 439/66; 439/927

(58) Field of Search .................... 439/66, 927, 289, 439/65, 78, 84, 608, 92, 75

(56) References Cited

U.S. PATENT DOCUMENTS 5,967,800 * 10/1999 Bishop ................................. 439/66

\* cited by examiner

Primary Examiner—Neil Abrams
Assistant Examiner—Javaid Nasri
(74) Attorney, Agent, or Firm—Charles J. Fassbender; Mark T. Starr; Lise A. Rode

(57) ABSTRACT

A connector for sending power to an IC-chip thru four pressed joints in series includes a solid conductive block having a top surface with a first pair of spaced-apart channels and a bottom surface with a second pair of spaced apart channels. The connector also includes a first springy contact having a center section which touches the top surface of the block in the space between the first pair of channels, and having two ends which are held by the first pair of channels. The connector further includes a second springy contact having a center section which touches the bottom surface of the block in the space between the second pair of channels, and having two ends which are held by the second pair of channels.

11 Claims, 10 Drawing Sheets

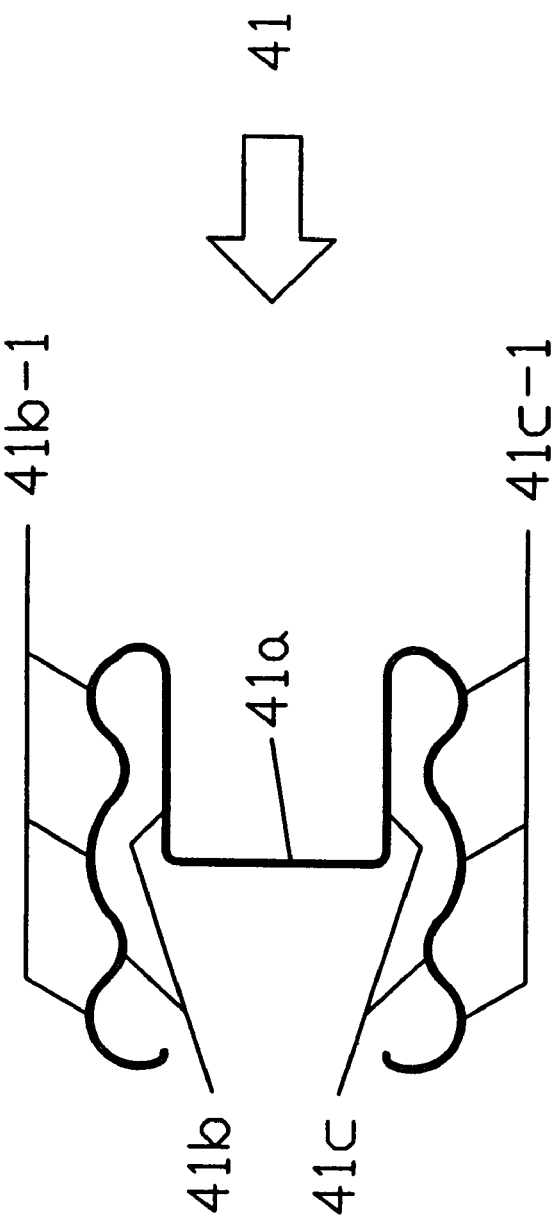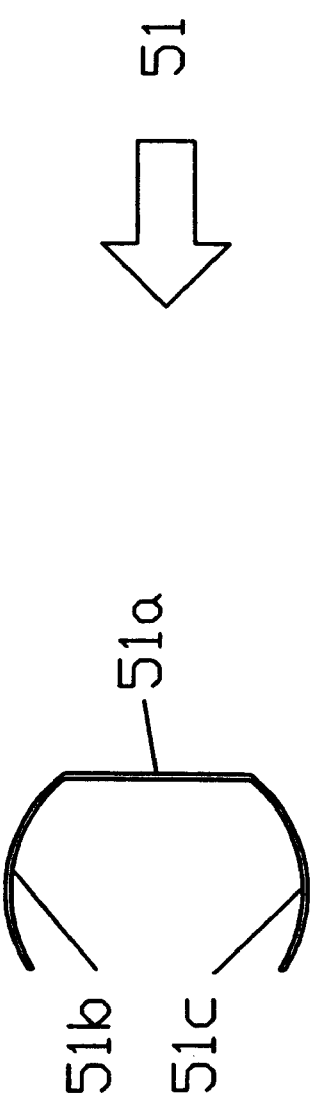
FIG. 5
FIG. 6

CONNECTOR FOR SENDING POWER TO AN IC-CHIP THRU FOUR PRESSED JOINTS IN SERIES

RELATED CASE

The present invention, as identified by the above title and docket number, is related to another invention which is identified as follows: "CONNECTOR FOR SENDING POWER TO AN IC-CHIP THRU TWO PRESSED JOINTS IN SERIES" having U.S. Ser. No. 09/754,507. Patent applications on both of these inventions were filed concurrently on Oct. 11, 2000; and they have one common Detailed Description.

BACKGROUND OF THE INVENTION

The present invention relates to the structure of power connectors which carry electric current from a power source on one module, thru pressed joints with the connector, to the power input terminal in an integrated circuit chip (IC-chip) on another module.

Throughout the history of the IC-chip industry, the number of transistors which have been integrated into a single IC-chip has steadily increased; and consequently, the amount of current which is needed to supply power to the IC-chip has also steadily increased. Today, a typical CMOS microprocessor IC-chip requires a power source which can supply about fifty amps; and, the projections are that in a few years, a typical microprocessor IC-chip will require a power source which can supply about one-hundred-fifty amps.

In the prior art, a common practice is to attach the IC-chip to one module and send electrical power to the IC-chip from a power source which is on another separate module. This is done, for example, in test equipment which sequentially tests a large number of IC-chips that are mass produced. There a printed circuit board is provided which holds several of the IC-chips that are to be tested; and this printed circuit board is sequentially connected and disconnected to the test equipment thru a power connector and a signal connector. The power connector carries current from a power source to the IC-chips on the printed circuit board while the signal connector carries test signals to and from those IC-chips.

Conventionally, the power connector is a "pin and socket" type of connector. In this type of connector, the "pin" is a solid metal cylinder with a typical length of about one inch and a typical diameter of about one-half inch; and, the "socket" is a metal member that has cylindrical shaped hole into which the pin snugly fits.

However, a problem with the pin and socket type of connector is that each time a connection is to be made, the pin must be perfectly aligned with the hole in the socket. If the pin is out of line with the socket hole, then the pin will hit the socket when they are moved together; and damage to the connector and/or the two modules can occur. This damage can be quite extensive where the two modules are moved together automatically by mechanisms which are motor driven. To avoid such damage, various alignment mechanisms can be employed; however, any alignment mechanism adds to the cost of the overall system.

Also in the prior art, a "fuzz button" type of connector has been disclosed which avoids the alignment problem of the pin and socket type of connector. A fuzz button consists of a thin strand of wire which has been wadded up into the shape of a button. In a fuzz button type of connector, the fuzz button is held in a hole on a flat surface of the connector, and a portion of the fuzz button protrudes from the hole past the flat surface. This connector is attached to one module; a flat metal contact pad is provided on the other module; and a connection is made between the two modules by pressing the portion of the fuzz button which protrudes from the hole against the flat contact pad. Here, the fuzz button need not be perfectly aligned with the contact pad.

However, one problem with the fuzz button type of connector is that the hole which holds the fuzz button must always be kept in an upright position. Otherwise, the fuzz button can fall out of the hole and thereby make the connector inoperable. Thus the fuzz button is not suitable for use in a printed circuit board which holds several IC-chips that are to be tested, and which is manually handled with various orientations as it is repeatedly connected and disconnected to the test equipment.

Also, another problem with the fuzz button is that its thin strand of wire has a current carrying capacity of only about one amp. Thus, to carry fifty to one-hundred fifty amps of current to the power input of an IC-chip, a connector which holds a large number of fuzz buttons would be required. However, that presents a reliability problem because as the number of fuzz buttons in a connector increases, the probability of one or more fuzz buttons falling out of their respective hole increases.

Accordingly, a primary object of the present invention is to provide a connector for sending current to the power input of an IC-chip by which all of the above described problems are avoided.

BRIEF SUMMARY OF THE INVENTION

In accordance with the present invention, a connector for sending power from a power source on one module, to an IC-chip on another module, includes a solid conductive block having a top surface with a first pair of spaced-apart channels and a bottom surface with a second pair of spaced apart channels. Also the connector includes a first springy contact having a center section which touches the top surface of the block in the space between the first pair of channels, and having two ends which are held by the first pair of channels. Further the connector includes a second springy contact having a center section which touches the bottom surface of the block in the space between the second pair of channels, and having two ends which are held by the second pair of channels.

To transfer electrical power from the power source thru the connector to the IC-chip, four pressed joints are made. The first pressed joint occurs between the center section of the first springy contact and a flat metal power pad which is provided on the module that holds the power source to receive current from that source. The second pressed joint occurs between the center section of the first springy contact and the top surface of the connector block. The third pressed joint occurs between the center section of the second springy contact and the bottom surface of the connector block. And, the fourth pressed joint occurs between the center section of the second springy contact and a flat metal power pad which is provided on the module that holds the IC-chip to send current to that IC-chip.

One desirable attribute of the above connector is that a connection is made between the center section of the first springy contact and its corresponding power pad even when they are not perfectly aligned. Similarly, a connection is made between the center section of the second springy contact and its corresponding power pad even when they are not perfectly aligned. Also, the above connector remains operable in any orientation because the first springy contact and the second springy contact are held firmly in their pair of spaced-apart channels regardless of the orientation of the connector. Further, the above connector is capable of carrying a current of fifty to one-hundred-fifty amps.

BRIEF DESCRIPTION OF THE FIGURES

FIG. 5 shows a first modification to the connector in FIGS. 1–3.

FIG. 6 shows a second modification to the connector in FIGS. 1–3.

DETAILED DESCRIPTION

Figure 1:
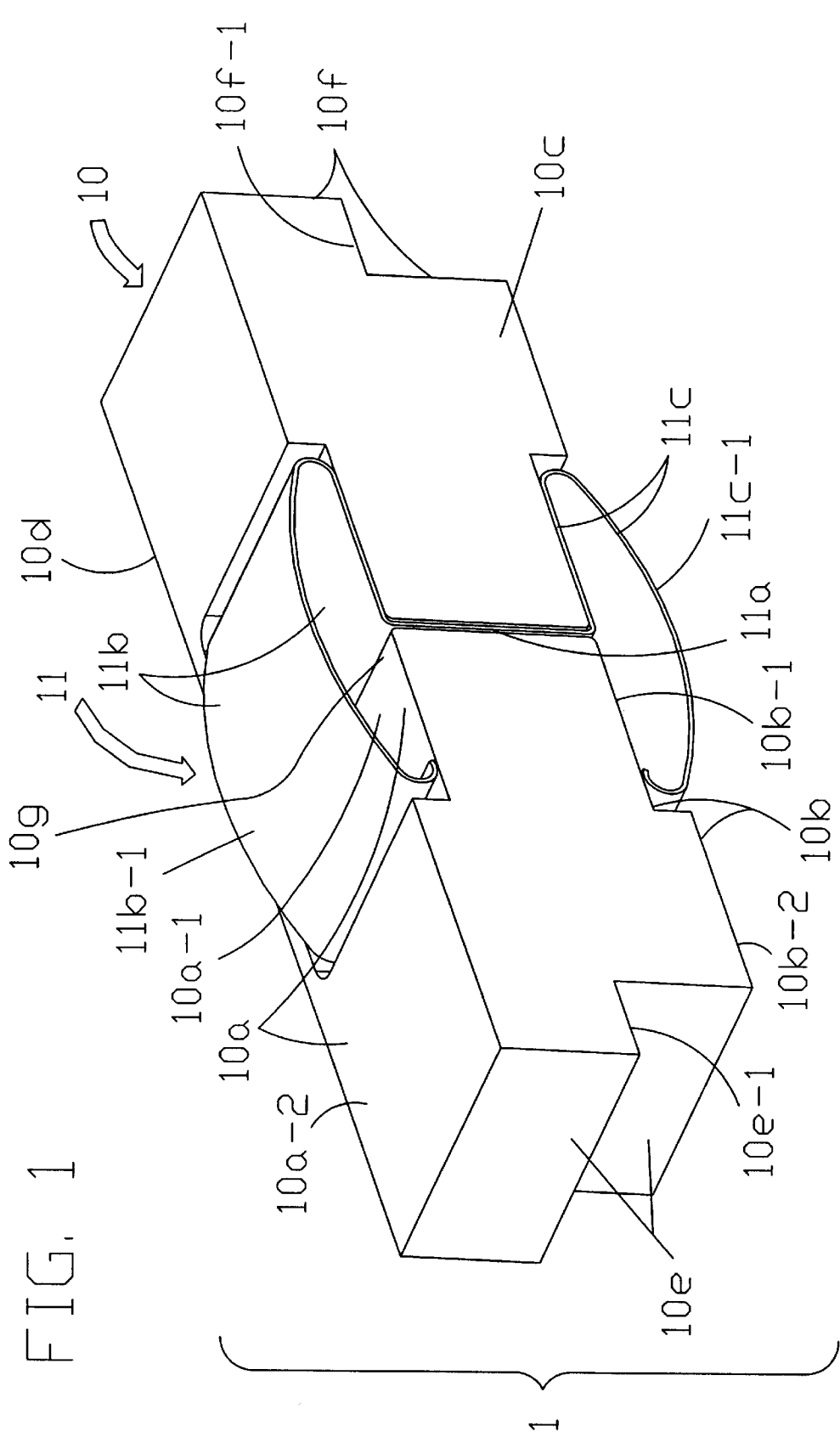
FIG. 1 shows a connector which is one preferred embodiment of the present invention.

A connector 1, which is one preferred embodiment of the present invention, will now be described in detail with reference to FIG. 1. This connector 1 is comprised of an electrically insulative block 10 and a springy strip of metal 11. Block 10 has several structural features which are identified by reference numerals 10a, 10a-1, 10a-2, 10b, 10b-1, 10b-2, 10c, 10d, 10e, 10e-1, 10f, 10f-1, and 10g; and those features are described below in TABLE 1. Similarly, the springy strip of metal has several structural features which are identified by reference numerals 11a, 11b, 11b-1, 11c, and 11c-1; and those features are also described below in TABLE 1.

TABLE 1

| Structural Feature | Description |
|---|---|
| 10a, 10a-1, 10a-2 | Feature 10a is the top surface of the block 19, and this top surface has two separate regions 10a-1 and 10a-2. Region 10a-1 is a flat central region of the surface 10a. Region 10a-2 surrounds the central region 10a-1 on three sides and lies above that central region. |
| 10b, 10b-1, 10b-2 | Feature 10b is the bottom surface of the block 10, and this bottom surface has two separate regions 10b-1 and 10b-2. Region 10b-1 is a flat central region of the surface 10b. Region 10b-2 surrounds the central region 10b-1 on three sides and lies below that central region. |
| 10c | Feature 10c is one side of the block 10. |
| 10d | Feature. 10d is another side of the block 10 which is opposite the side 10c. |
| 10e, 10e-1 | Feature 10e is one end of the block 10. This end 10e has & step. 10e-1. |
| 10f, 10f-1 | Feature 10f is one end of the block 10 which is opposite to the end 10e. This end 10f has a step 10f-1. |
| 11a | Feature 11a is & flat central section of the springy metal strip 11. This section 1a is held in the slot 10g of the block 10. |
| 11b, 11b-1 | Feature 11b is a first end section of the metal strip 11 which extends from the central section 11a. This first end section 11b includes a springy arch-shaped input contact 11b-1 which is cantilevered over the flat central region 10a-1 of the block 10. |
| 11c, 11c-1 | Feature 11c is a second end section of the metal strip 1 which extends from the central section 11a. This second end section 11c includes a springy arch-shaped output contact 11c-1 which is cantilevered under the flat central region 10b-1 of the block 10. |

How the connector 1 is combined with several other components to form a subassembly that receives electrical power from a power source, will now be described with reference to FIG. 2. In the FIG. 2 subassembly, the connector 1 is attached as shown to a printed circuit board 20 by a bracket 21 and a pair of screws 22a and 22b. Bracket 21 holds the connector block 10 such that the springy input contact 11b-1 is compressed against a flat metal power pad 23 on the printed circuit board 20.

Bracket 21 completely surrounds and loosely touches the connector 1 on its two sides 10c and 10d and two ends 10e and 10f. Thus the connector can move in the bracket 21 perpendicular to the printed circuit board 20. The portion of bracket 21 which touch the two connector ends 10e and 10f have respective steps 21a and 21b, and the compressed springy input contact 11b-1 urges block 10 away from the printed circuit board 20 until the steps 21a and 21b engage the steps 10e-1 and 10f-1 on the block. When the steps 21a, 21b, 10e-1, and 10f-1 are engaged, a gap 24 occurs between the printed circuit board 20 and region 10a-2 on the top surface of the connector block 10.

Also attached to the printed circuit board 20 is a DC-DC electrical power converter 25. This power converter 25 has an input terminal (not shown) which receives DC electrical power at one voltage, and it has an output terminal 25a on which DC electrical power is generated at another voltage. Power from the output terminal 25a is sent on a conductor 25 thru the power pad 23 to the input contact 11b-1 of the connector 1.

Figure 2:
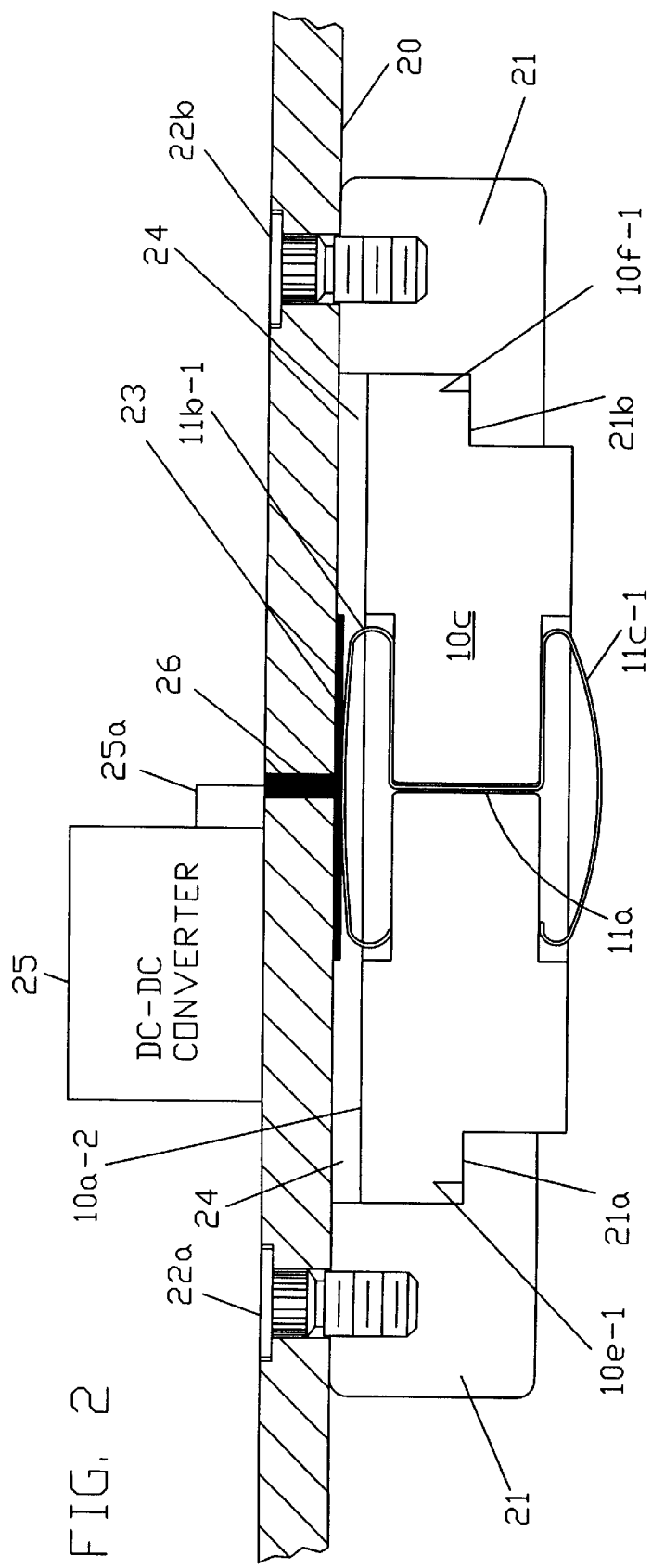
FIG. 2 shows a subassembly in which the connector of FIG. 1 receives electrical power from a power source.
Figure 3:
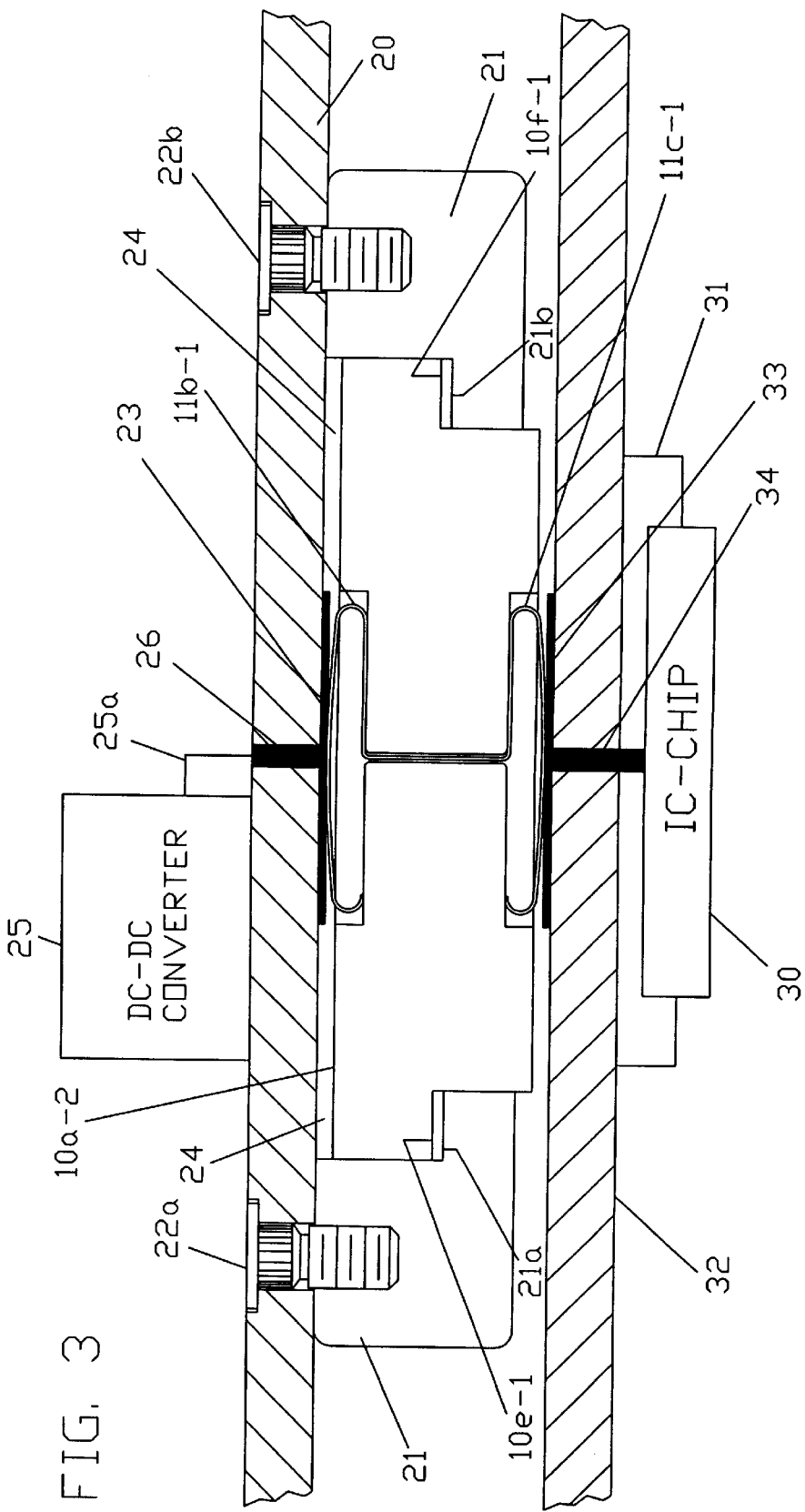
FIG. 3 shows an assembly in which electrical power is sent from the connector in the subassembly of FIG. 2 to an IC-chip.

Referring now to FIG. 3, it shows how the subassembly of FIG. 2 is incorporated into a larger assembly to transfer electrical power to an IC-chip 30. In the assembly of FIG. 3, the IC-chip 30 is held by a socket 31 which is attached to a printed circuit board 32. A flat metal power pad 33 is provided on the printed circuit board 32, and a conductor 34 carries power from the pad 33 to the IC-chip 30.

To send electrical power to the power pad 33, that power pad is pressed against the output contact 11c-1 of the connector 1. When such pressing occurs, the force which is exerted by the power pad 33 is opposed by both the springy input contact 11b-1 and the springy output contact 11c-1. Consequently, both of the contacts 11b-1 and 11c-1 get compressed; and that causes the steps 10e-1 and 10f-1 to move away from the steps 21a and 21b. Thus in FIG. 3, the steps 10e-1 and 10f-1 are separated from the steps 21a and 21b, and the connector block 10 "floats" between the two printed circuit boards 20 and 32.

One desirable attribute of the above described connector 1 is that it has a low contact resistance. Consequently, the connector 1 is suitable for use in making a power connection which carries a large current without causing a large voltage drop across the connector.

Figure 4:
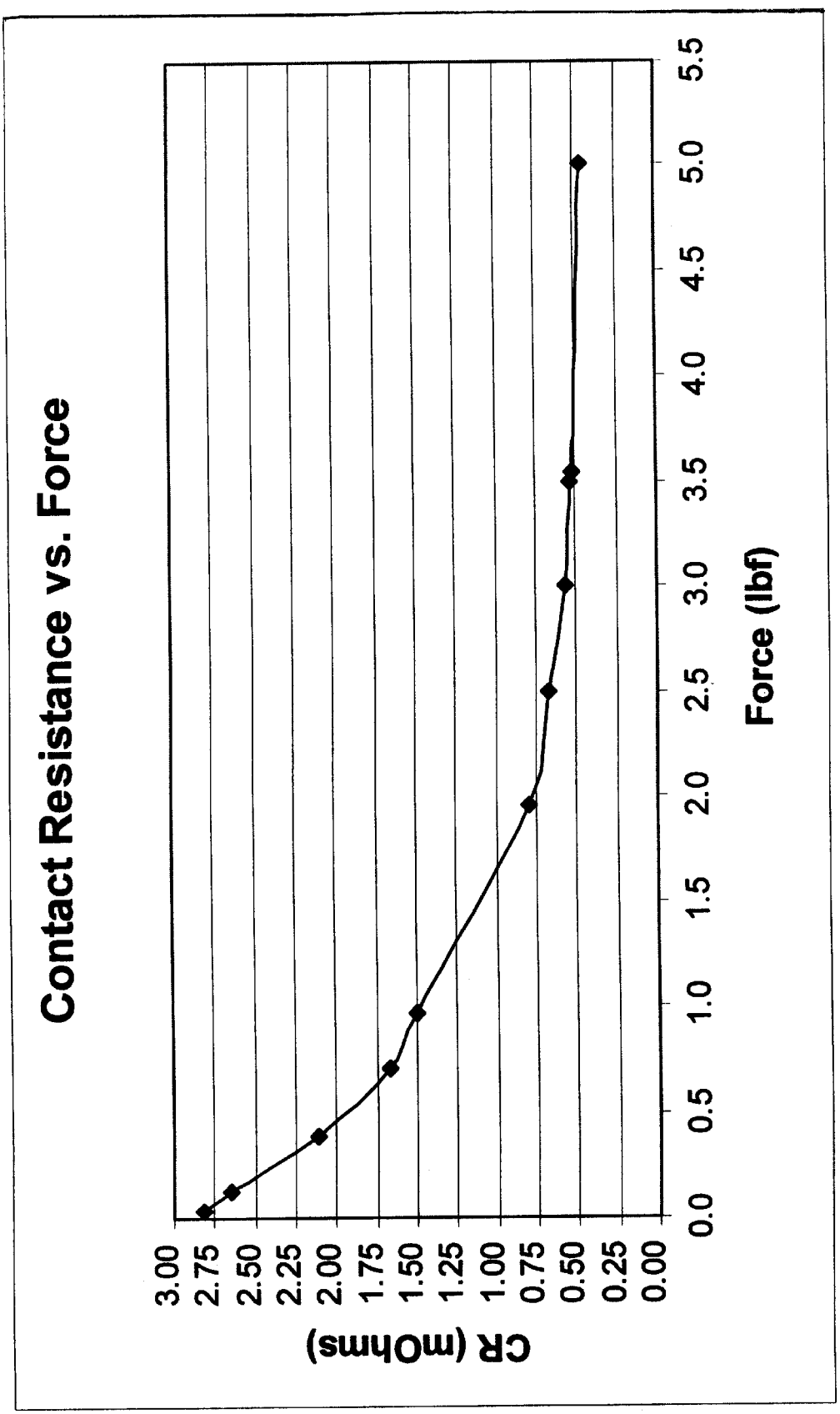
FIG. 4 shows how contact resistance thru the connector of FIGS. 1–3 varies as a function of force.

Test results which show the contact resistance of one actual connector 1 are illustrated in FIG. 4. In that particular connector, the input contact 10b-1 and the output contact 10c-1 were each 0.546 inches by 0.320 inches. Contact resistance (CR) for the connector as shown in FIG. 4, is the resistance thru the pressed joint between the input contact 11b-1 and pad 23 plus the resistance thru the pressed joint between the output contact 11c-1 and pad 33. Force on the horizontal axis as shown in FIG. 4 is the force with which pad 33 presses against the output contact 11c-1.

Inspection of FIG. 4 shows that the contact resistance reaches a minimum value of about one-half million when the force between pad 33 and the output contact 11c-1 is three and one-half pounds. If the force is increased any further, the contact resistance stays nearly constant because it is limited by the size of the contact area in each pressed joint. To lower the minimum contact resistance, the size of the input contact 11b-1 and the output contact 11c-1 and their corresponding power pads need to be increased.

Another desirable attribute of the above described connector 1 is that the input contact 11b-1 and the output contact 11c-1 are protected from being overstressed while the power pad 33 is pressed against the output contact. Protection for the input contact 11b-1 occurs due to the fact that the input contact is surrounded on three sides by region 10a-2 of connector block 10. Protection for the output contact 11c-1 occurs due to the fact that the output contact is surrounded on three sides by region 10b-2 of the connector block 10.

Still another desirable attribute of the above described connector 1 is that the output contact 11c-1 and the power pad 33 do not need to be perfectly aligned in order for a connection to occur between them. This is important in a mass production environment where it is expensive and/or impractical to perfectly align the output contact 11c-1 with the power pad 33 each time the assembly of FIG. 3 is replicated. By comparison, when a connection is made between a pin and a socket, the pin must be in perfect alignment with the socket, or else the pin will not fit into the socket.

Yet another desirable attribute of the above described connector 1 is the ease with which it can be manufactured. To begin, the connector block 10 and the springy metal strip 11 are separately produced. Next, the center section 11a of the springy metal strip 11 is simply inserted into slot 10g of the connector block 10. Then, to attach the connector 1 to the printed circuit board 20, the connector 1 is simply placed in the socket 21 which in turn is screwed onto the printed circuit board.

A connector 1, which constitutes one preferred embodiment of the present invention, has now been described in detail. Also, a subassembly has been described in detail in which the connector 1 receives electrical power from a DC-DC power converter; and, a larger assembly has been described in detail in which the connector 1 transfers electrical power to an IC-chip. Now, various changes and modifications which can be made to the above details will be described.

As a first modification, the springy strip of metal 11 in FIGS. 1–3 is replaced with another springy strip of metal 41 as shown in FIG. 5. This metal strip 41 has a flat central section 41a, a first end section 41b which extends from the central section as shown, and a second end section 41c which extends from the central section as shown. The first end section 41b includes a springy input contact 41b-1 which has multiple arches. Similarly, the second end section 41c includes a springy output contact 41c-1 which has multiple arches. Each arch in the input contact 41b-1 makes contact with the power pad 23 in the FIG. 3 assembly; and each arch in the output contact 41c-1 makes contact with the power pad 33 in the FIG. 3 assembly.

As a second modification, the springy strip of metal 11 FIGS. 1–3 is replaced with another springy strip of metal 51 as shown in FIG. 6. This metal strip 51 has a flat central section 51a, a first end section 51b which extends from the central section, and a second end section 51c which extends from the central section. The first end section 51b and the second end section 51c bend as shown in only one direction away from the central section 51a. This is in comparison to the springy strip of metal in FIG. 1 wherein the end section 11b and 11c bend at a right angle away from the central section 11a and thereafter bend in an opposite direction back towards the central section.

Figures 7, 8:
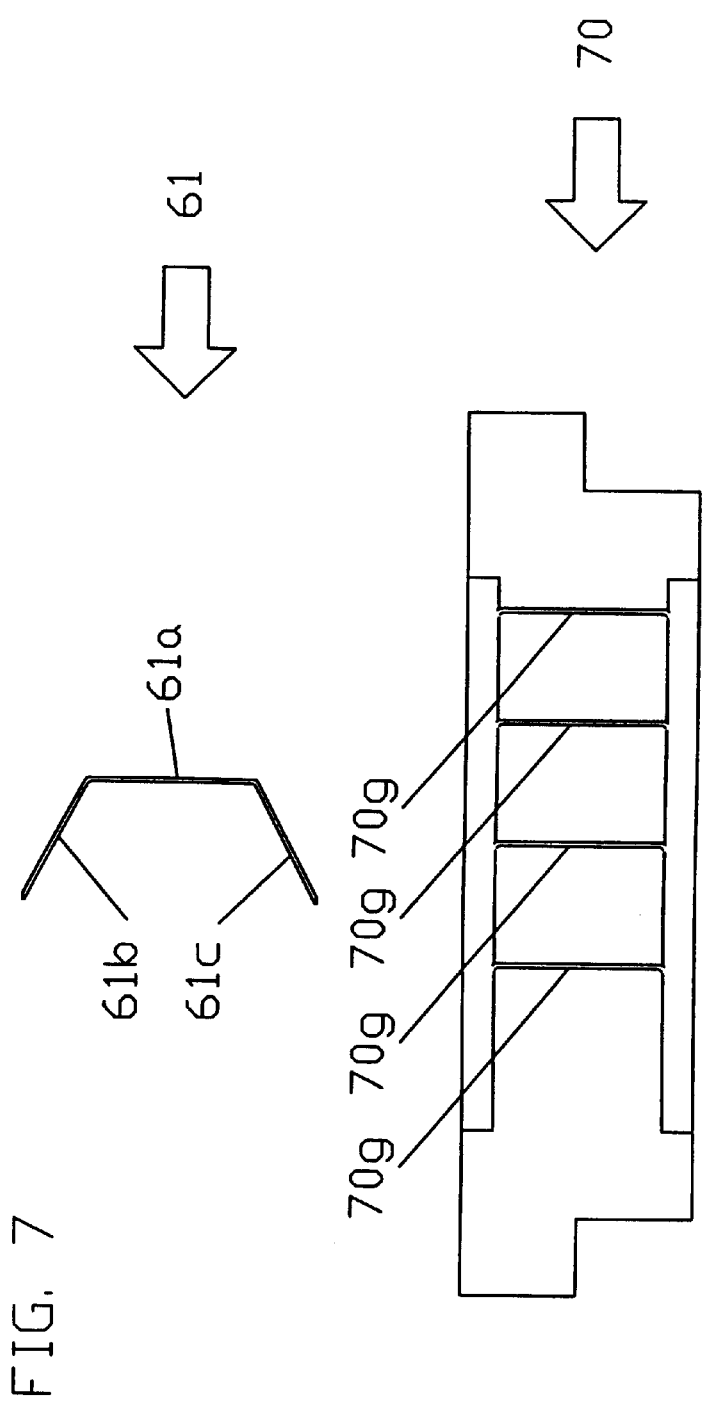
FIG. 7 shows a third modification to the connector in FIGS. 1–3.
FIG. 8 shows a fourth modification to the connector in FIGS. 1–3.

As a third modification, the springy strip of metal 11 in FIGS. 1–3 is replaced with another springy strip of metal 61 as shown in FIG. 7. This metal strip 61 has a flat central section 61a, a first end section 61b which extends from the central section, and a second end section 61c which extends from the central section. Each end section 61b and 61c is straight, as shown. By comparison, each end section 51b and 51c in FIG. 6 is bent into a single arch.

As a fourth modification, the connector block 10 in FIGS. 1–3 is replaced with another connector block 70 as shown in FIG. 8. This connector block 70 is the same as the connector block 10 except that it has multiple slots 70g instead of just a single slot 10g. In FIG. 8, the connector block 70 is shown as having four slots 70g as an example. Each slot 70g is used to hold the central section of any one of the springy metal strips 11, 41, 51, or 61. Thus when the connector block 70 is incorporated into the assembly of FIG. 3, it holds four of the springy metal strips 11, 41, 51, or 61 against the power pad 23 and the power pad 33.

As a fifth modification, the connector block 10 in FIGS. 1–3, as well as the connector block 70 in FIG. 8, can be made of an electrically conductive material, such as aluminum. With that modification, the path which the current takes from the input contact 11b-1 to the output contact 11c-1 will be shortened by the conductive connector block itself. By comparison, when the connector block 10 in FIGS. 1–3 and the connector block 70 in FIG. 8 are made of a non-conductive material such as plastic, the cost of manufacturing the block is minimized.

Next, with reference to FIG. 9, a connector 81, which is second preferred embodiment of the present invention, will be described in detail. This connector 81 is comprised of an electrically conductive block 90 and a pair of springy contacts 91 and 92. Several structural features of the conductive block 90 are identified in FIG. 9 by reference numerals 90*a*, 90*a*-1, 90*a*-2, 90*a*-3, 90*a*-4, 90*b*, 90*b*-1, 90*b*-2, 90*b*-3, 90*b*-4, 90*c*, 90*e*, 90*e*-1, 90*f* and 90*f*-1; and those structural features are described below in TABLE 2.

TABLE 2

| Structural Feature | Description |
| --- | --- |
| 90a, 90a-1, 90a-2 | Feature 90a is the top surface of the block 90, and this top surface has two separate regions 90a-1 and 90a-2. Region 90a-1 is a central region of the top surface 90a. Region 90a-2 borders the central region 90a-1 on two sides and lies above that region. |
| 90a-3, 90a-4 | Features 90a-3 and 90a-4 are a pair of channels which are spaced apart in the central region 90a-1 of the top surface of block 90. |
| 90b, 90b-1, 90b-2 | Features 90b is the bottom surface of the block 90, and this bottom surface has two separate regions 90b-1 and 90b-2. Region 90b-1 is a central region of the bottom surface 90b. Region 90b-2 borders the central region 90b-1 on two sides and lies below that region. |
| 90b-3, 90b-4 | Features 90b-3 and 90b-4 are a pair of channels which are spaced apart in the central region 90b-1 of the bottom surface of block 90. |
| 90c | Feature 90c is one side of the block 90. Block 90 also has an opposite side which is hidden from view in FIG. 9. This opposite side has the same shape as side 90c and is parallel to side 90c. |
| 90e, 90e-1 | Feature 90e is one end of the block 90. This end 90e has a step 90e-1. |
| 90f, 90f-1 | Feature 90f is one end of the block 90 which is opposite to the end 90e. This end 90f has a step 90f-1. |

Figure 9:
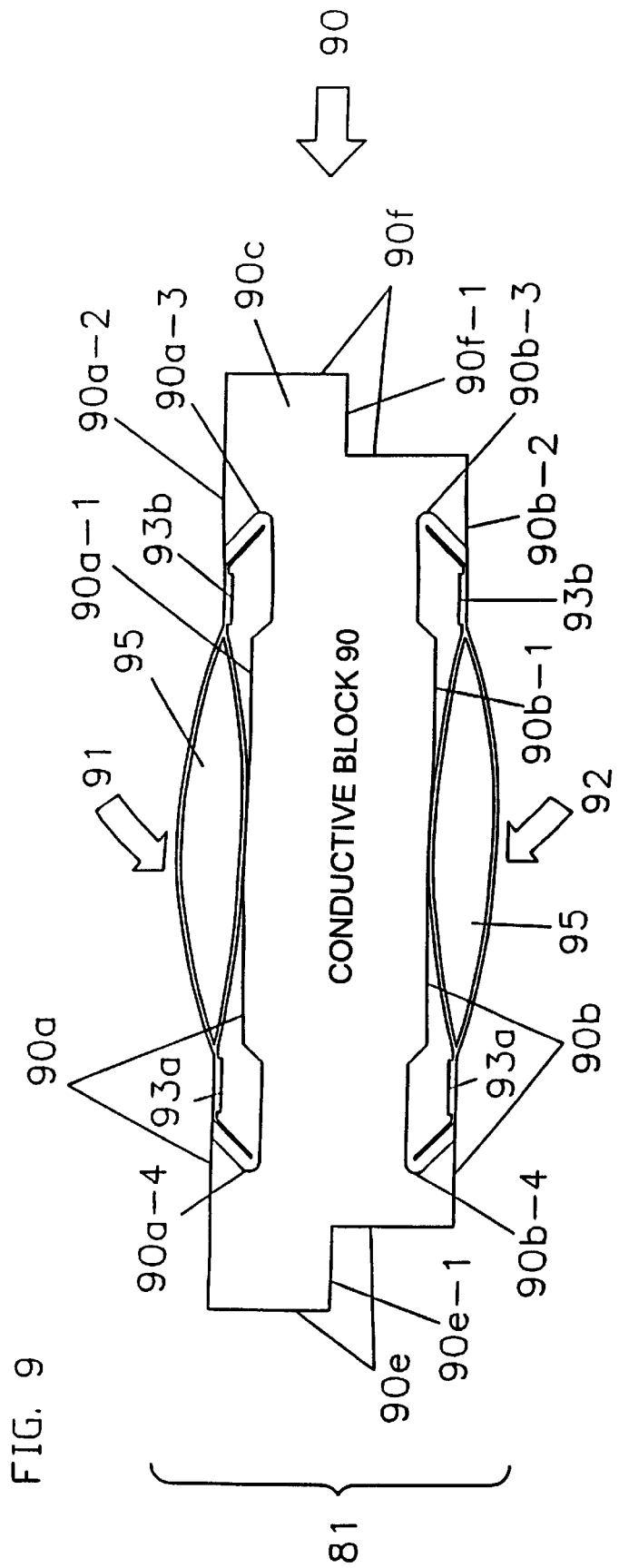
FIG. 9 shows a connector which is a second preferred embodiment of the present invention.
Figure 11:
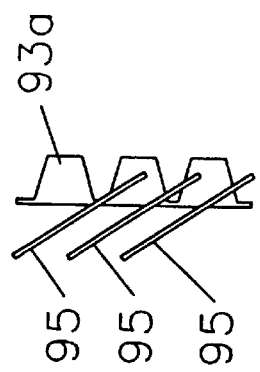
FIG. 11 shows a sectional view, taken along lines A—A, of the springy contact in FIG. 10.

In the connector 81 of FIG. 9, the springy contact 91 is held as shown against the central region 90*a*-1 of the top surface of the conductive block 90 by the pair of channels 90*a*-3 and 90*a*-4. Similarly, in the connector 81 of FIG. 9, the springy contact 92 is held as shown against the central region 90*b*-1 of the bottom surface of the conductive block 90 by the pair of channels 90*b*-3 and 90*b*-4. Each springy contact 91 and 92 has the same structural features; and those features are shown in detail of FIGS. 10 and 11.

Figure 10:
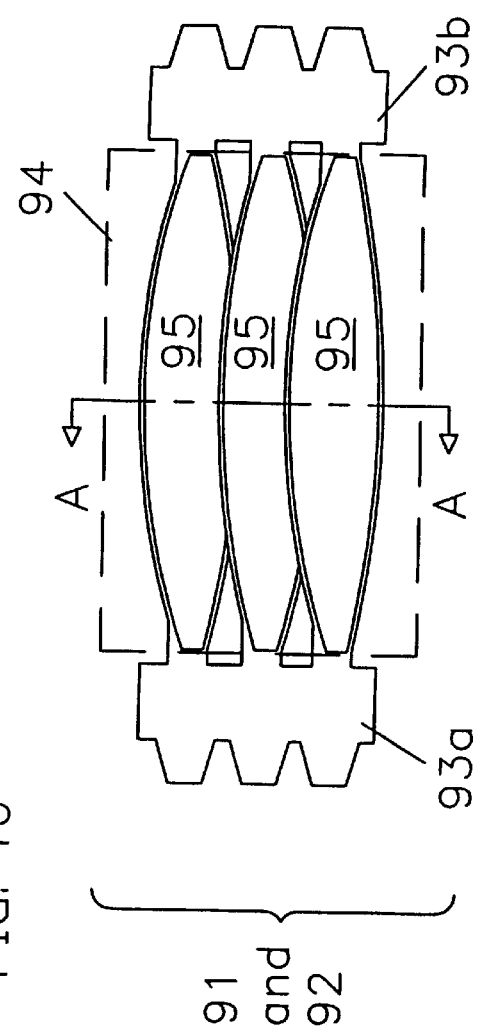
FIG. 10 shows a top view of a springy contact which occurs twice in the connector of FIG. 9.

Each springy contact 91 and 92 has two spaced apart end sections 93*a* and 93*b* which are connected to a center section 94. This center section 94 is comprised of a selectable number of torsion springs 95 which lie in parallel to each other. In FIG. 10, a total of three torsion springs 95 are shown as just one example.

Each torsion spring 95 consists of a single strip of metal which is substantially flat. In the connector 81, the strip of metal is held by the end sections 93*a* and 93*b* at an acute angle relative to region 90*a*-1 or region 90*b*-1 of the conductive block 90. Thus in the connector 81, only one edge of the metal strip in each torsion spring 95 contacts the top surface 90*a* or the bottom surface 90*b* of block 90. The opposite edge of the metal strip in each torsion spring 95 provides a contact to an external power pad which sends power to the connector 81 or receives power from the connector.

How the connector 81 is combined with other components to form a subassembly 100, that receives electrical power from a power source, will now be described with reference to FIG. 12. In the subassembly 100, the other components with which the connector 81 is combined are the same components with which the previously described connector 1 is combined in FIG. 2. Those components are a printed circuit board 20, a bracket 21, a pair of screws 22*a* and 22*b*, a power pad 23, a DC-DC power converter 25, and a conductor 26.

In the subassembly 100, power from the DC-DC converter 25 is sent on output terminal 25*a* thru conductor 26 to the power pad 23. Each torsion spring 95 in the springy contact 91 is twisted between the power pad 93 and region 90*a*-1 of the conductive block 90. Thus, each torsion spring 95 in the springy contact 91 forms one pressed joint with the power pad 93 and another pressed joint with region 90*a*-1 of block 90. Thru those pressed joints, power is transferred from the power pad 23 to the conductive block 90.

Figure 12:
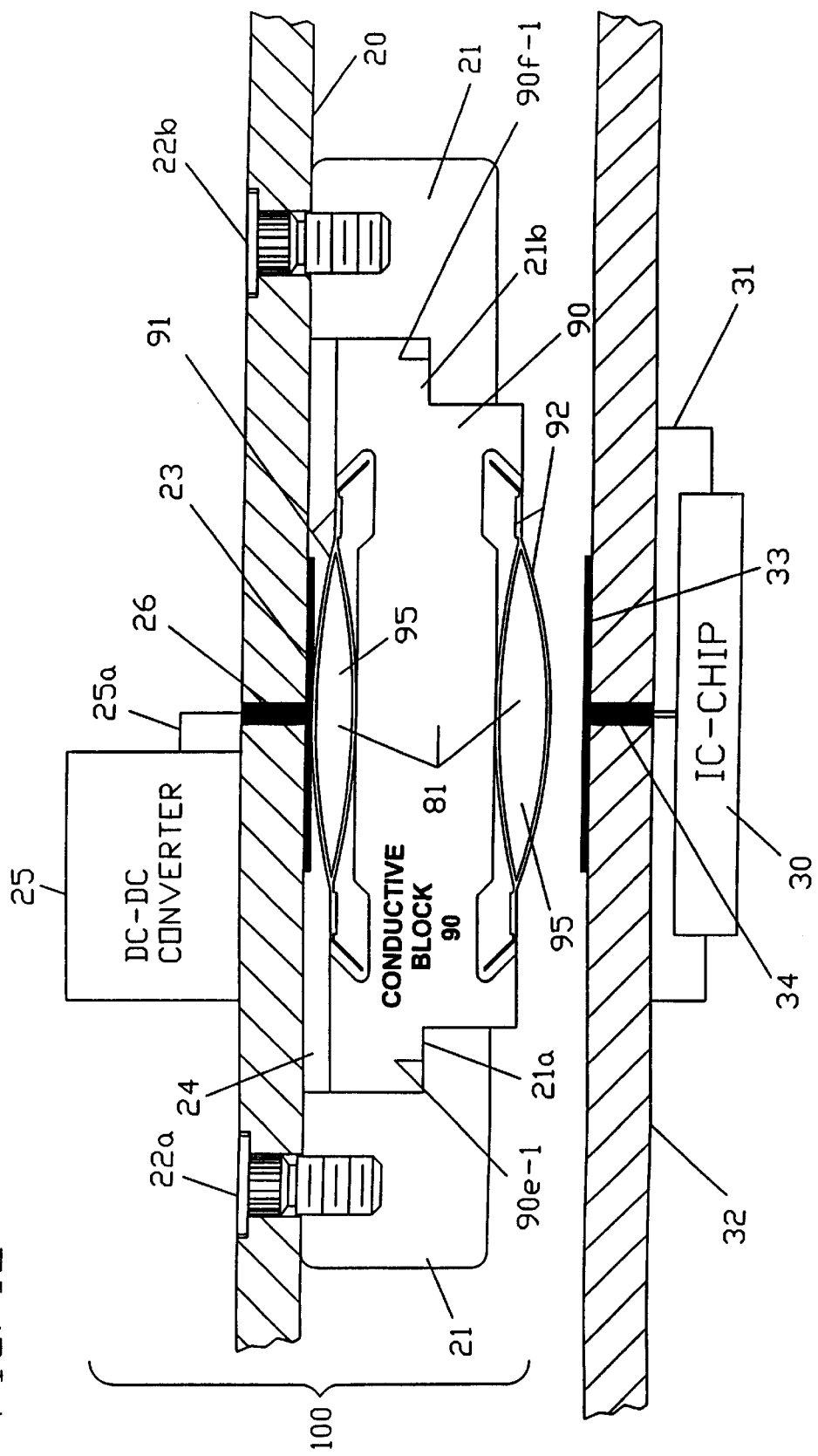
FIG. 12 shows a subassembly in which the connector of FIG. 9 receives electrical power from a power source; and, it also shows how power is sent from the subassembly to an IC-chip.

How the subassembly 100 is used to transfer electrical power to an IC-chip is also illustrated in FIG. 12. There, the IC-chip is identified by reference numeral 30; and it is held by a socket 31 which is attached to a printed circuit board 32. A flat metal power pad 33 is provided on the printed circuit board 32, and a conductor 34 connects the power pad 33 to the IC-chip 30. All of the components 30–34 are the same as were previously described in conjunction with FIG. 3.

To send electrical power to the power pad 33, that power pad is pressed against the springy contact 92 of the connector 81 in the subassembly 100. When such pressing occurs, the force which is exerted by the power pad 33 is opposed by each torsion spring 95 in the springy contact 92 and each torsion spring 95 in the springy contact 91. Consequently, all of those torsion springs twist; and that causes the steps 90*e*-1 and 90*f*-1 to move away from the steps 21*a* and 21*b*. Thus, the connector block 90 "floats" between the two printed circuit boards 20 and 32.

When the power pad 33 is pressed against the springy contact 92 as described above, each torsion spring 95 in the springy contact 92 forms one pressed joint with the power pad 33 and another pressed joint with region 90*b*-1 of block 90. At the same time, each torsion spring 95 in the springy contact 91 forms one pressed joint with the power pad 23 and another pressed joint with region 90*a*-1 of block 90. Through all of those pressed joints, electrical power is transferred from the power pad 23 to the power pad 33, and from there, to the IC-chip 30.

With the connector 81 of FIGS. 9–12, a low contact resistance is obtained because current passes in parallel thru all of the torsion springs 95 in the springy contact 91, and current passes in parallel thru all of the torsion springs 95 in the springy contact 92. Also with the connector 81 of FIGS. 9–12, all of the torsion springs 95 are protected from being overstressed because the regions 90-1, 90*a*-2, 90*b*-1 and 90*b*-2 of the connector block 90 limit how much the torsion springs 95 can be twisted.

Further with the connector 81 of FIGS. 9–12, the springy contact 92 and the power pad 93 do not need to be perfectly aligned in order for a connection to occur between them, and thus the connector is suitable for use in a mass production environment. Also the connector 81 of FIGS. 9–12 is easily manufactured. To begin, the connector block 90 and the springy contacts 91 and 92 are separately produced. Then, to assemble to the connector 81, the ends 93*a* and 93*b* of contact 91 are simply slid into the channels 90*a*-3 and 90*a*-4 on the connector block 90; and, the ends 93*a* and 93*b* of contact 92 are simply slid into the channels 90*b*-3 and 90*b*-4 of the connector block 90.

Figure 13:
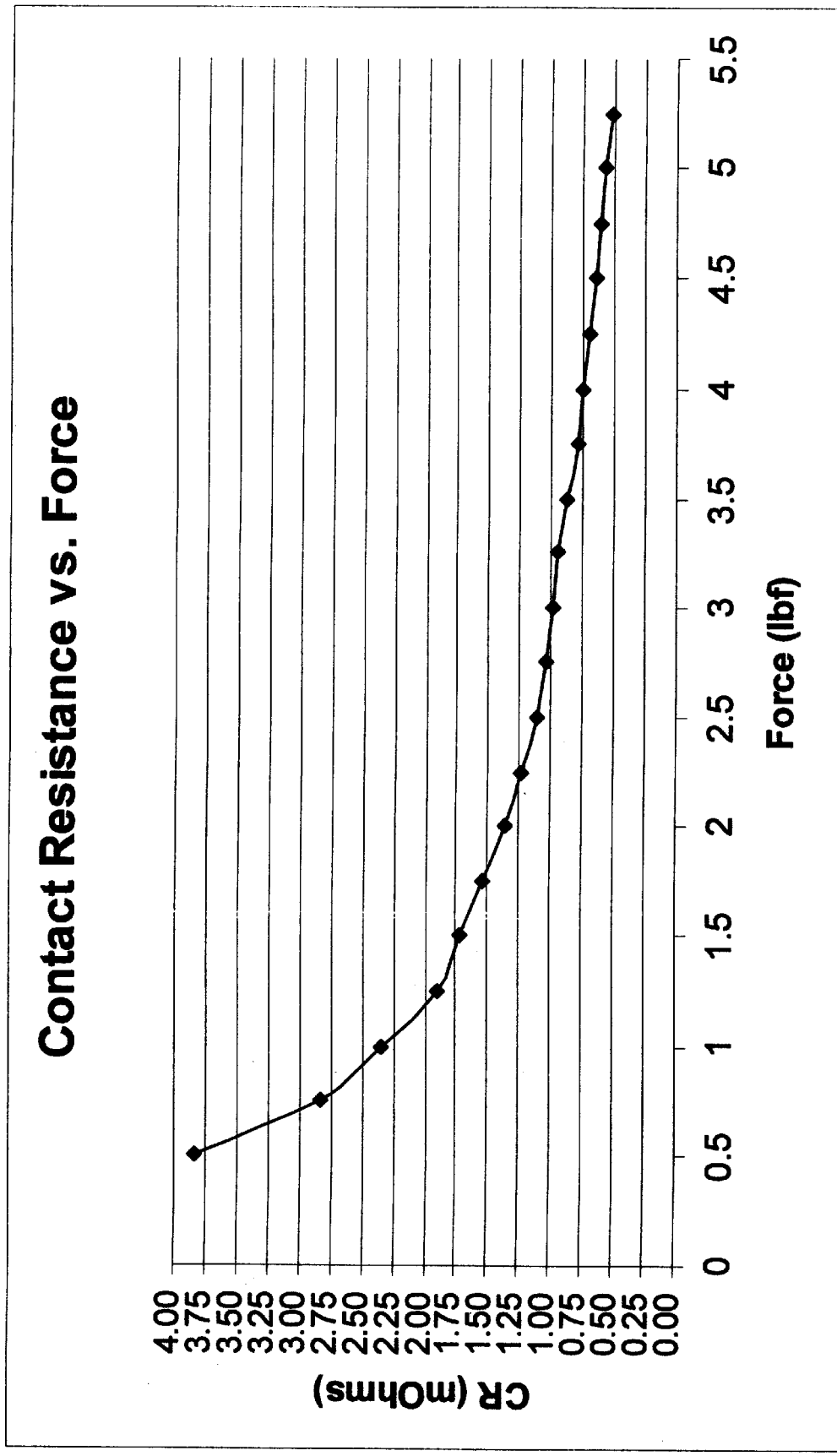
FIG. 13 shows how contact resistance thru the connector of FIGS. 9–12 varies as a function of force.

Test results which show the contact resistance of one actual connector 81 are illustrated in FIG. 13. For that particular connector, each torsion spring 95 is 0.700 inches long, 0.150 inches wide at its center, and 0.055 inches wide at its ends. Also for that particular connector, the springy input contact 91 and the springy output contact 92 each included a total of three of the torsion springs 95. Contact resistance (CR) for the connector, as shown in FIG. 13, is the resistance thru the pressed joints which couple the input power pad 23 to the connector block 90 plus the resistance thru the pressed joints which couple the output power pad 33 to the connector block 90. Force on the horizontal axis in FIG. 13 is the force with which the power pad 33 presses against the springy output contact 92.

Two connectors, which constitute two preferred embodiments of the present invention, have now been described in detail, along with subassemblies and assemblies in which those connectors are used, and along with several modifications to the connectors themselves. Accordingly, it is to be understood that the present invention is not limited to the details of any one particular connector, subassembly, assembly, or modification, but is defined by the appended claims.

What is claimed is:

1. A connector for sending power to an IC-chip thru four pressed joints in series; said connector being comprised of:
   a solid conductive block having a top surface with a first pair of spaced-apart channels and a bottom surface with a second pair of spaced-apart channels;
   a first springy contact having a center section which touches said top surface of said block between said first pair of spaced-apart channels, and having two ends which are held by said first pair of spaced-apart channels; and,
   a second springy contact having a center section which touches said bottom surface of said block between said second pair of spaced-apart channels, and having two ends which are held by said second pair of spaced-apart channels.

2. A connector according to claim 1 wherein said center section of said first springy contact includes a torsion spring which twists against said top surface of said block, and said center section of said second springy contact includes a torsion spring which twists against said bottom surface of said block.

3. A connector according to claim 2 wherein said top surface of said block has a raised region that extends at least partway around said torsion spring in said first springy contact, and said bottom surface of said block has a raised region that extends at least partway around said torsion spring in said second springy contact.

4. A connector according to claim 3 wherein said torsion spring in said first springy contact is substantially flat and has one edge which touches said top surface of said block; and said torsion spring in said second springy contact is substantially flat and has one edge which touches said bottom surface of said block.

5. A connector according to claim 4 wherein said torsion spring in said first springy contact is a strip of metal that is held by said two ends of said first springy contact at an acute angle relative to said top surface of said block and said torsion spring in said second springy contact is a strip of metal that is held by said two ends of said second springy contact at an acute angle relative to said bottom surface of said block.

6. A connector according to claim 1 wherein said center section of said first springy contact includes multiple metal strips, each of which extends between said two ends of said first springy contact and touches said top surface; and s aid center section of said second springy contact includes multiple metal strips, each of which extends between said two ends of said second springy contact and touches said bottom surface.

7. A connector according to claim 6 wherein each one of said multiple metal strips in said first springy contact is a torsion spring which twists against said top surface of said block; and each one of said multiple metal strips in said second springy contact is a torsion spring which twists against said bottom surface of said block.

8. A connector according to claim 7 wherein each one of said multiple metal strips in said first springy contact is substantially flat and has one edge which touches said top surface of said block; and each one of said multiple metal strips in said second springy contact is substantially flat and has one edge which touches said bottom surface of said block.

9. A connector according to claim 8 wherein each one of said multiple metal strips in said first springy contact lie at an acute angle relative to said top surface of said block; and, each one of said multiple strips in said second springy contact lie at an acute angle relative to said bottom surface of said block.

10. A connector according to claim 9 wherein said multiple metal strips in said first springy contact overlap each other; and said multiple metal strips in said second springy contact overlap each other.

11. A connector according to claim 1 and further including a printed circuit board which has a flat metal power pad that said first springy contact presses against and thereby urges said block away from said printed circuit board; and, a bracket coupled to said printed circuit board which engages said block when said first springy contact has moved said block a predetermined distance from said printed circuit board.

* * * * *